United States Patent [19]

Yamada

[11] Patent Number: 4,654,685

[45] Date of Patent: Mar. 31, 1987

[54] SOLID-STATE PHOTOELECTRICAL IMAGE TRANSDUCER WHICH OPERATES WITHOUT COLOR FILTERS BOTH AS AN IMAGER AND AS A VISUAL DISPLAY

[75] Inventor: Takahiro Yamada, Osaka, Japan

[73] Assignee: Matsushita Electric Industrial Company Limited, Kadoma, Japan

[21] Appl. No.: 515,277

[22] Filed: Jul. 19, 1983

[30] Foreign Application Priority Data

Jul. 19, 1982 [JP] Japan .................................. 57-126392
Dec. 14, 1982 [JP] Japan .................................. 57-219439

[51] Int. Cl.$^4$ ..................... H01L 27/14; H01L 31/00; H01L 29/80; H01L 27/02
[52] U.S. Cl. ......................................... 357/30; 357/22; 357/41
[58] Field of Search ...................... 357/22, 24, 30, 41

[56] References Cited

U.S. PATENT DOCUMENTS

3,378,688  4/1968  Kabell ................................. 357/41
3,775,623  11/1973 Kamiyama et al. .................... 357/41
4,333,022  6/1982  Whelan et al. ........................ 357/24
4,450,464  5/1984  Yamada ................................ 357/30

Primary Examiner—Gene M. Munson
Attorney, Agent, or Firm—Cushman, Darby & Cushman

[57] ABSTRACT

A solid-state photoelectrical transducer comprises a plurality of multilayered semiconductive structures. Each of the multilayered structures comprises a charge transfer layer, a photoelectrical conversion layer having an array of photoelectrical conversion regions, and an intermediate layer sandwiched between the charge transfer layer and the photoelectrical conversion layer. The intermediate layer is of opposite conductivity type to the conductivity type of the other layers and includes a pair of electrically resistive regions adapted for connection to a potential source for inducing in the intermediate layer a pair of field potential distributions having oppositely inclined gradients to cause depletion of charges to occur between the charge transfer layer and each one of the photoelectrical conversion regions.

18 Claims, 15 Drawing Figures

SOLID-STATE PHOTOELECTRICAL IMAGE TRANSDUCER WHICH OPERATES WITHOUT COLOR FILTERS BOTH AS AN IMAGER AND AS A VISUAL DISPLAY

BACKGROUND OF THE INVENTION

The present invention relates to photoelectrical conversion.

Conventional solid-state image detectors for color television systems are overlayed with a color filter having its striped colors in registry with an array of elemental areas where radiant energy is converted to a video signal. Due to the fact that conventional color filters are formed of organic materials, they are susceptible to exposure to heat and strong light and their lifetime is therefore shorter than the lifetime of the semiconductor imager. A further disadvantage is that the degree of precision currently attainable with organic filters is much lower than that attained in the manufacture of semiconductor devices. The manufacture of small size organic filters encounters increasing difficulty with the tendency of miniaturization. Furthermore, the spatial arrangement of primary colors limits the resolution of images. On the other hand, conventional solid-state imagers are driven by clock pulses for reading the stored picture information. However, the effort in increasing the number of picture elements for high quality images met with difficulty in providing a satisfactory driving circuit. RF interference can occur if the clock frequency is increased to drive high resolution imagers. In addition, conventional imagers do not allow parallel and random scannings.

The same holds true to solid-state display panels which currently rely on light-emitting diodes or electroluminescent devices. In comparison with cathode ray tubes, available spectral characteristics are severely limited.

SUMMARY OF THE INVENTION

It is therefore an object of the present invention to provide a photoelectrical image transducer which operates without color filters.

It is another object of the present invention to provide a photoelectrical image transducer which operates both as an imager and as a visual display.

It is another object of the present invention to provide a photoelectrical image transducer which allows the same process to be employed for manufacturing both image detectors and display panels.

It is a further object of the invention to provide a photoelectrical image transducer which permits detection and reconstruction of three-dimensional images.

It is a still further object of the invention to provide a high resolution photoelectrical image transducer which imposes no limitations on the scanning rate.

According to a feature of the present invention, a photoelectrical transducer comprises a plurality of multilayered semiconductive structures. Each of the multilayered structures comprises a charge transfer layer, a photoelectrical conversion layer having an array of photoelectrical conversion regions, and an intermediate layer sandwiched between the charge transfer layer and the photoelectrical conversion layer. The intermediate layer is of opposite conductivity type to the conductivity type of the other layers and includes a pair of electrically resistive regions adapted for connection to a potential source for inducing in the intermediate layer a pair of field potential distributions having oppositely inclined gradients to cause depletion of charges to occur between the charge transfer layer and each one of the photoelectrical conversion regions.

BRIEF DESCRIPTION OF THE DRAWINGS

The present invention will be described in further detail with reference to the accompanying drawings, in which.

DETAILED DESCRIPTION

Figure 1:
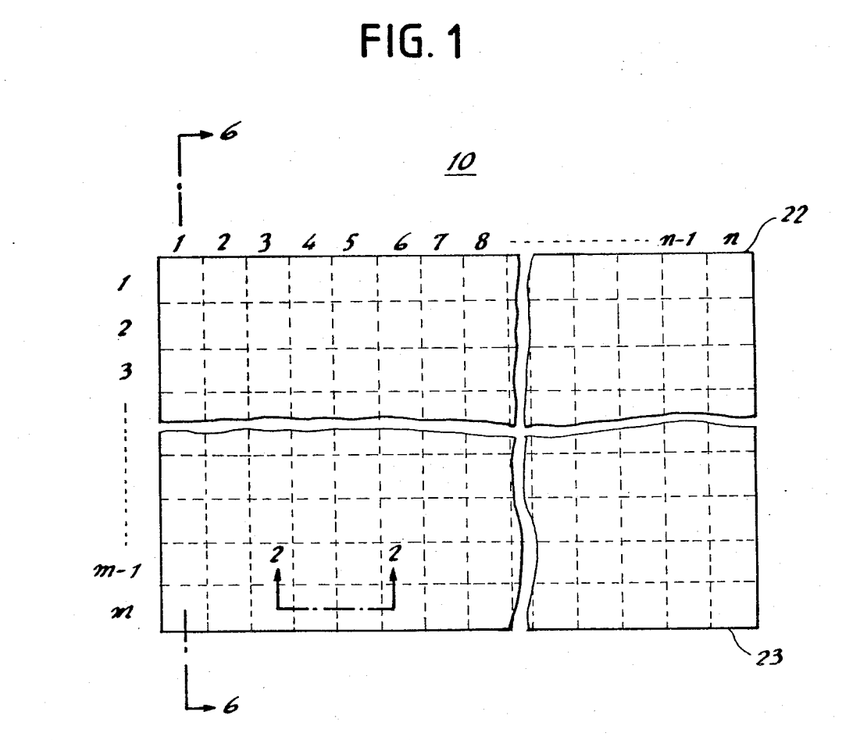
FIG. 1 is a schematic plan view of the photoelectrical conversion panel of the present invention.

Referring now to FIG. 1, there is shown an electro-optical image transducer of a first embodiment of the present invention for conversion of imagewise radiant energy to a video signal. The transducer comprises an array of square-shaped pixels arranged in rows #1 to #m and columns #1 to #n on a semiconductor panel 10. The transducer is constructed of one or more layers of identical configuration. For purposes of disclosure, the transducer panel 10 has three layers of different characteristics of absorption of light for deriving primary color video signals.

Figure 2:
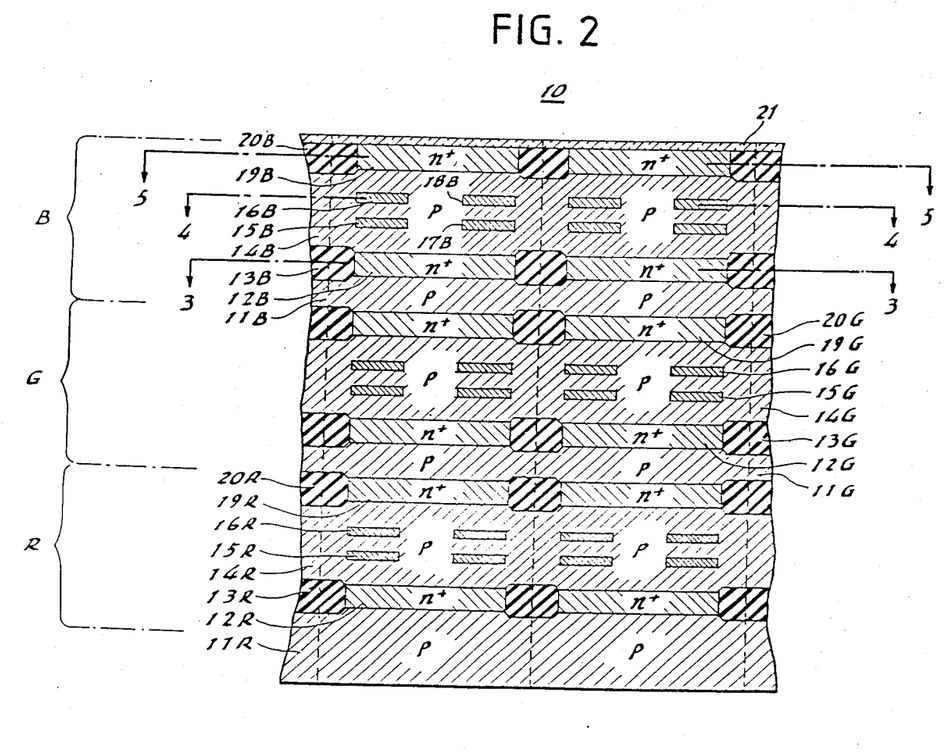
FIG. 2 is a cross-sectional view taken along the line 2—2 of FIG. 1.
Figure 3:
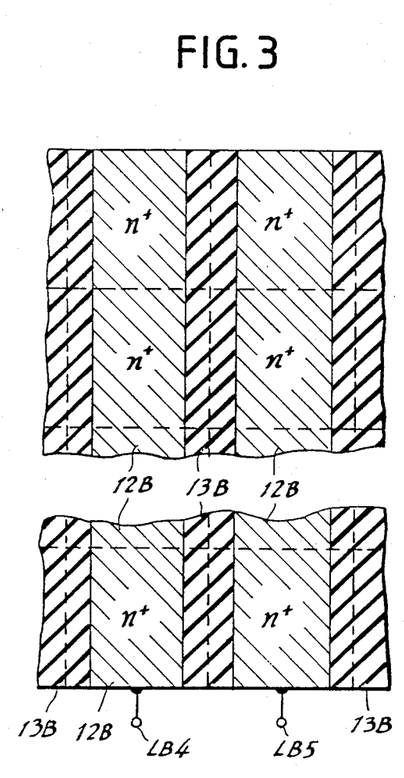
FIG. 3 is a cross-sectional view taken along the lines 3—3 of FIG. 2.
Figure 4:
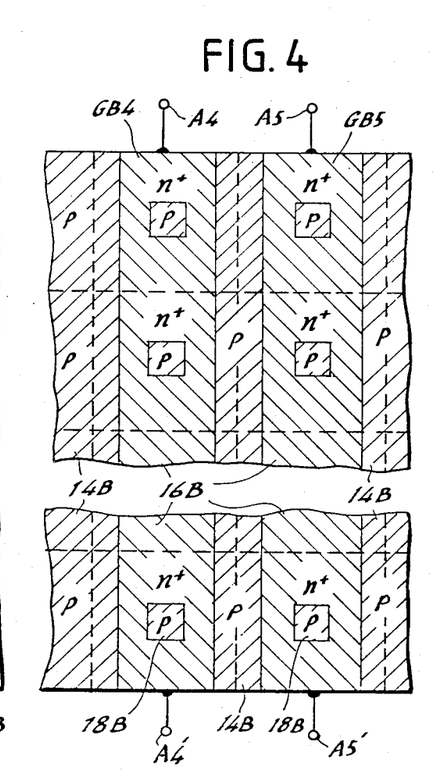
FIG. 4 is a cross-sectional view taken along the lines 4—4 of FIG. 2.

In FIG. 2 which is a rowwise cross-section of pixels on columns #4 and #5, the transducer panel 10 comprises a top layer designated B for absorption of the blue region of the visible spectrum, a middle layer G for absorption of the green region of the spectrum and and a bottom layer R for absorption of the red region of the spectrum. On the layer B is a transparent protective coating 21. Each of these layers is an identical pattern of a multi-layered structure and comprises a p-type conductivity layer 11 which extends over the full area of the panel 10, and an n+-type conductivity layer 12 which is separated into a plurality of bands of n+ regions which extend in the columnwise direction by insulative bands 13 as can best be seen in FIG. 3. On the n+ layer 12 is a p-type layer 14 which extends over the full area of the panel. In the p-type layer 14 is embedded a pair of columnwise extending, vertically spaced apart bands 15 and 16 of n+ conductivity. These n+ conductivity bands 15 and 16 are formed with a series of square-shaped windows 17 and 18 which are vertically aligned with each other as can best be seen in FIG. 4. The p-type layer 14 is overlayed with a top layer of n+ conductivity type which is divided into as many n+ regions 19 as there are pixels in the panel by a mesh-structure of insulator 20, as clearly seen in FIG. 5. The panel is covered on top by a transparent protective coating 21 on which light is made to be incident.

Figure 5:
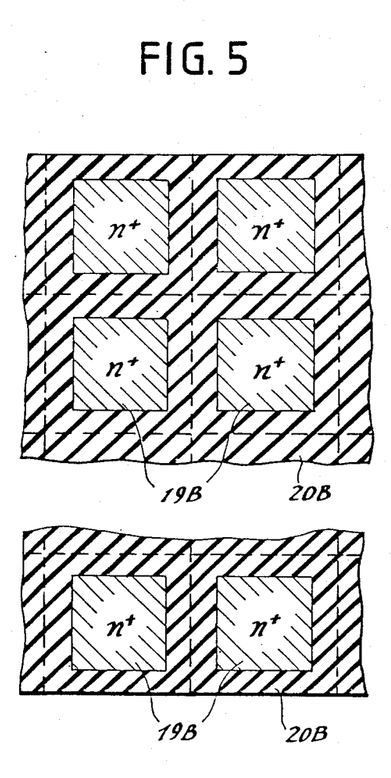
FIG. 5 is a cross-sectional view taken along the lines 5—5 of FIG. 2.

A pn junction between the p-type region 14 and each of its overlying n+ regions 19 constitute a photodiode of a particular light absorption characteristic for converting light incident thereon into an electrical signal. The n+ conductivity type bands 15 and 16 have such an electrical resistance that when biased across their length a field potential is induced in the p-type region 14 that varies linearly across the length to provide a depletion region in the windows 17 and 18 in a manner as will be described. The columnwise extending n+ conductivity region 12 serves as a charge transfer channel for conducting electrons to an external circuit.

Figure 6:
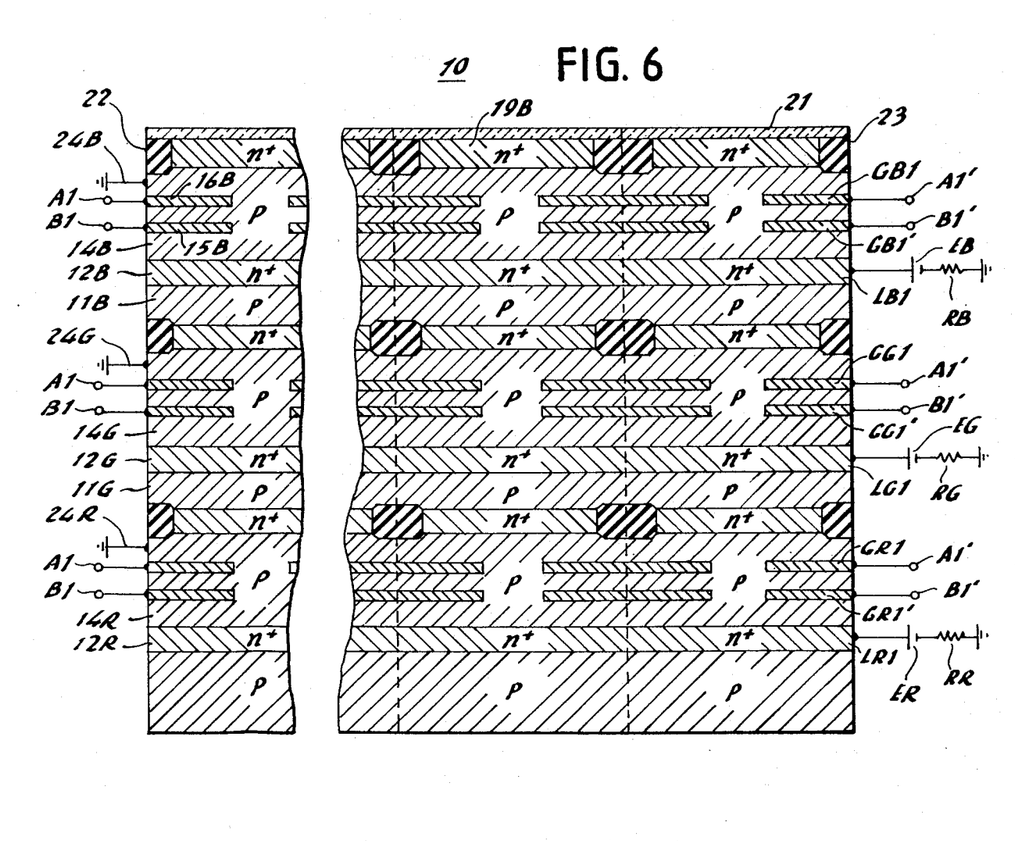
FIG. 6 is a cross-sectional view taken along the lines 6—6 of FIG. 1.

In FIG. 6 in which is shown a columnwise cross-section of pixels on column #1, the resistive electrodes 15 and 16 are shown extending columnwise between sides 22 and 23 of the panel 10 and connected at first ends to terminals $A_1$ and $B_1$ and at second ends to terminals $A_1'$ and $B_1'$ (where the subscripts represent the column #1). The p-type layer 14 is grounded as at 24. The charge transfer passage 12, also shown extending columnwise between sides 22 and 23, is connected at one end to a bias circuit including a DC voltage source E and a load resistor R which is connected between source E and ground. A video signal from pixels of a given column is derived from the load resistor associated with the given column.

Figure 7:
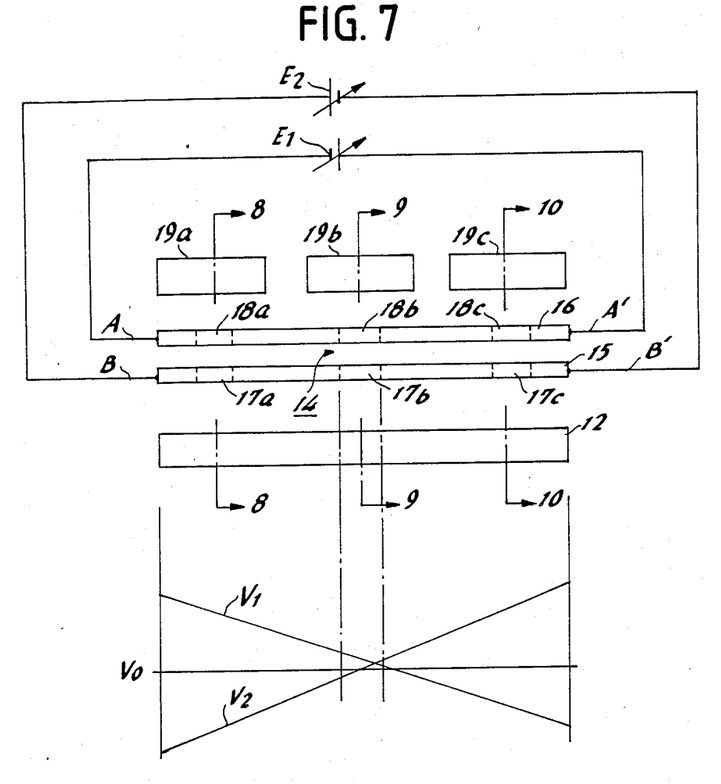
FIG. 7 is a schematic illustration of the transducer panel useful for describing the operating principle of the invention.
Figure 8:
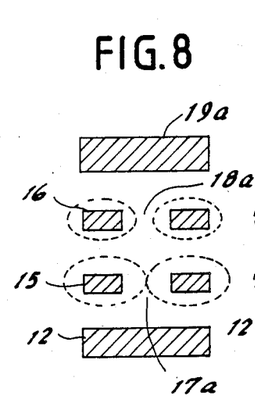
FIGS. 8, 9 and 10 are cross-sectional views taken along the lines 8—8, 9—9 and 10—10 of FIG. 7 respectively.
Figure 9:
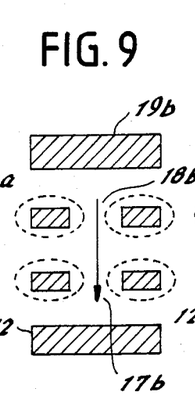
Figure 10:
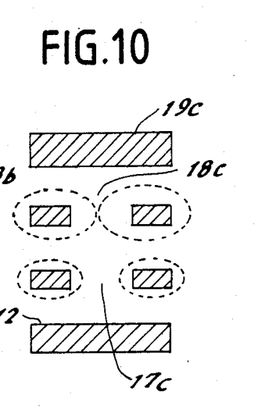

The operating principle of the present invention will now be described with reference to FIGS. 7 to 10. For the sake of simplicity, three pixels are schematically shown in FIG. 7. The resistive electrode 16 is impressed at the terminal A with a negative potential of a DC voltage source E1 and at the terminal A' with the positive potential of the source E1 to produce a field potential V1 in the windows 18a, 18b and 18c which varies as a function of distance from one end of the electrode 16, while the resistive electrode 15 is biased by a DC source E2 such that it creates a field potential V2 in the windows 17a, 17b and 17c whose gradient is opposite to the gradient V1. If the potential at which depletion occurs in the p-type semiconductor region 14 is represented by a potential Vo, depletion takes place in the windows 18a, 18b, 17b and 17c as best be seen in FIGS. 8, 9 and 10. As a result, charges developed in the photodiode region 19b, FIG. 9, will find a low impedance path to the charge transfer region 12. It is seen therefore that by varying the voltages applied to the electrodes 15 and 16 relative to each other, the depletion region is caused to move from one window to another and the charges developed at the pn junction between regions 14 and 19 of each color conversion layer can be scanned in the columnwise direction.

Figure 11:
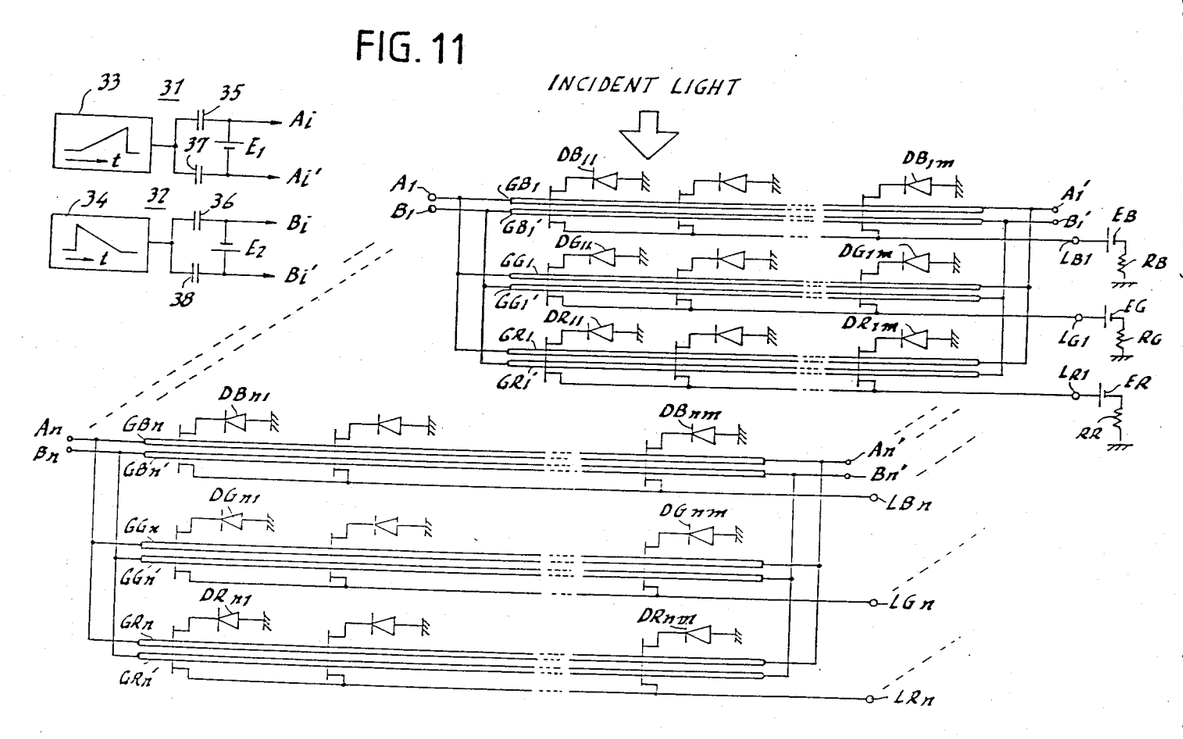
FIG. 11 is an illustration of an equivalent electrical circuit of the transducer panel with a scanning circuit associated therewith.

The image transfer panel of the invention can be represented by an equivalent electrical circuit as illustrated in FIG. 11. The pn junction between regions 14B and 19B of the blue-light sensitive layer B is represented by a photodiode DB with a subscript denoting the column number. The resistive scanning electrodes 16B and 15B are denoted by GB and GB' respectively, the charge transfer path 12B being denoted by LB. It is seen therefore that each pixel comprises a field effect transistor which is formed by two resistive electrodes serving as the gate, a photodiode serving as the source electrode and a transfer path serving as the drain electrode. As shown in FIG. 11, the terminal A of each scanning electrode G of each column is multipled to the other electrodes of the same column and connected to a first terminal Ai (where i represents the column number) of a first scanning voltage source 31 and the opposite terminal A' is also multipled to those of the same column and connected to a second terminal Ai' of the source 31. Likewise, the terminals B and B' of each scanning electrode G' of each column are multipled and connected to terminals Bi and Bi' of a second scanning voltage source 32.

The first scanning voltage source 31 comprises a ramp generator 33 which is capacitively coupled through capacitors 35 and 37 to the terminals Ai and Ai' across which a DC bias source E1 is connected. The second scanning voltage source 32 also comprises a ramp generator 34 which is capacitively coupled through capacitors 36 and 38 to the terminals Bi and Bi' across which a DC bias E2 is coupled. The ramp voltage developed in the generator 33 increases in amplitude as a function of time, whereas the voltage developed in the generator 34 decreases as a function of time. The voltages of the bias sources E1 and E2 are chosen so that in the absence of the ramp voltages, depletion occurs in the aligned windows in the array which located at one extreme end of the array. Upon application of the ramp voltages, the depletion region is shifted in the columnwise direction and the charges developed by incident light are successively transferred to the charge transfer passages LB, LG and LR and thence to load resistors RB, RG and RR. The scanning voltage sources 31 and 32 may be provided for each column. Alternatively, the terminals A, B, A' and B' of each column may be further multipled to the other columns and a single pair of scanning voltage sources simultaneously drives all the resistive electrodes for reading the electron charges into a video memory.

Figure 12:
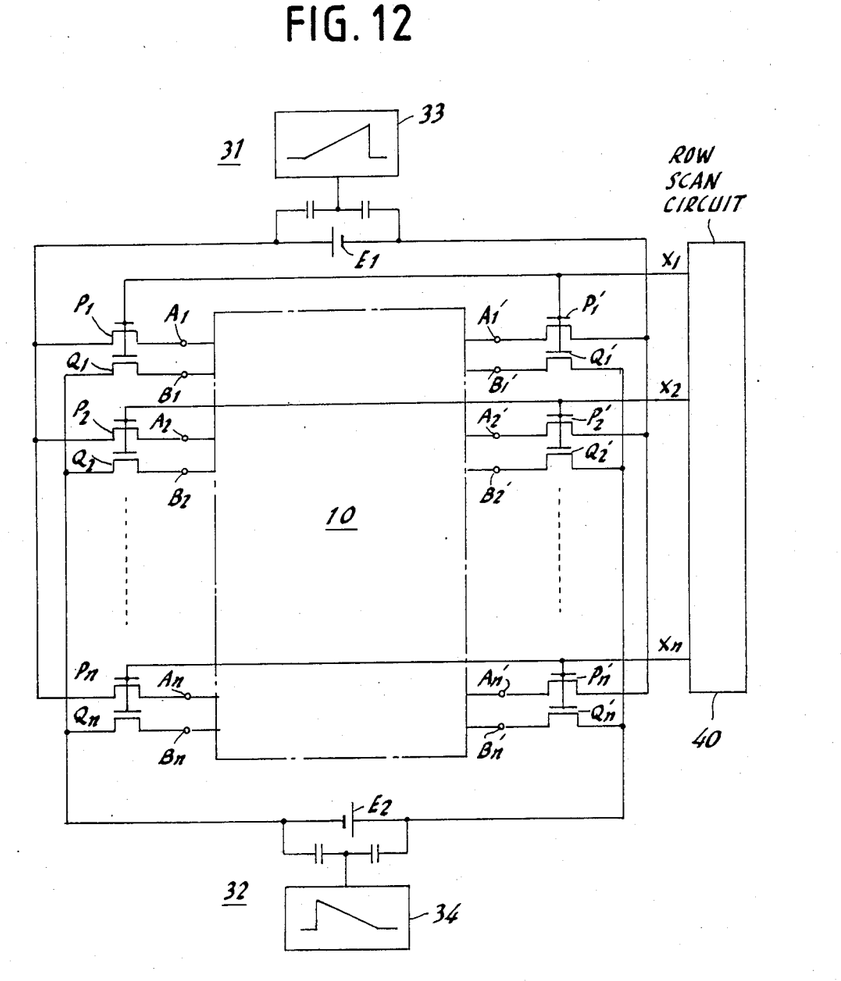
FIG. 12 is an illustration of a dot-sequential scanning circuit.

FIG. 12 is an illustration of a practical embodiment of the scanning circuit in which the columnwise scanning is successively shifted from one column to another in a manner identical to the standard color television system. The scanning circuit includes a first array of field-effect transistors P and Q and a second array of field-effect transistors P' and Q', the transistors P having their source electrodes multipled to one terminal of the scanning voltage source 31 and transistors P' having their source electrodes multipled to the other terminal of the voltage source 31. The transistors Q and Q' have their source electrodes multipled for connection to the terminals of the scanning voltage source 32. The drain electrodes of the transistors P and Q of the first array are coupled respectively to the A and B terminals of the associated column, while the drain electrodes of the transistors P' and Q' are coupled respectively to the A' and B' terminals of the associated column. The transistors Pi, Qi, Pi' and Qi' of the column "i" have their gate electrodes coupled together to a terminal Xi of a row scanning circuit 40. The row scanning circuit 40 generates a gating pulse which is successively applied to the terminals X1 to Xn to effect columnwise scanning during succesive row scan intervals. Since it is obvious for those skilled in the art to design a row scanning circuit, the details of this circuit are omitted.

The description will now be concerned with the material with which the panel 10 is constructed. The pn junction of each of the B, G and R layers has a particular bandgap energy to capture a desired spectral component. The desired bandgap energy is obtained by appropriately proportioning selected compounds. It is desirable that the n+ layers 19B, 19G and 19R have lattice constants of an equal value to provide as good interfacial characteristics as possible. For example, by selecting from the III-V group compounds, the layer 19B is formed of a mixture of AlP and $AlP_xSb_{1-x}$ in an appropriate proportion with an impuritity selected from Li, Se and Te to impart n+ conductivity to $AlP_xSb_{1-x}$. This enables the layer 19B to capture a spectral component in a range from 400 nanometers to 500 nanometers. The layer 19G is a mixture of $AlP_xSb_{1-x}$ and $Ga_yAl_{1-y}As$ in varying proportions to capture a spectral component in a range from 500 nanometers to 600 nanometers. To impart n+-type conductivity to the $Ga_yAl_{1-y}As$ compound, an impuritity selected from Li, Sn, Pb, O, S, Se and Te is doped. The layer 19R is formed of a mixture of $Ga_yAl_{1-y}As$ and $Ga_{y'}Al_{1-y'}As$ to capture a spectral component from 600 to 700 nanometers. It is preferable to employ the compositional grading technique to provide the varying proportions of the compounds.

The pn junctions may also be constructed of the II-VI group compounds. For example, the layer 19B is formed of $Zn_xCd_{1-x}Te_{1-y}$, the layer 19G is formed of a mixture of $Zn_xCd_{1-x}Te_{1-y}$ and $Zn_{x'}Cd_{1-x'}S_yTe_{1-y}$. The layer 19R is formed of a mixture of $Zn_{x'}Cd_{1-x'}S_yTe_{1-y}$ and $Zn_{x''}Cd_{1-x''}Te$. It is also preferable that the compositional grading technique be used in forming these layers.

Figure 13:
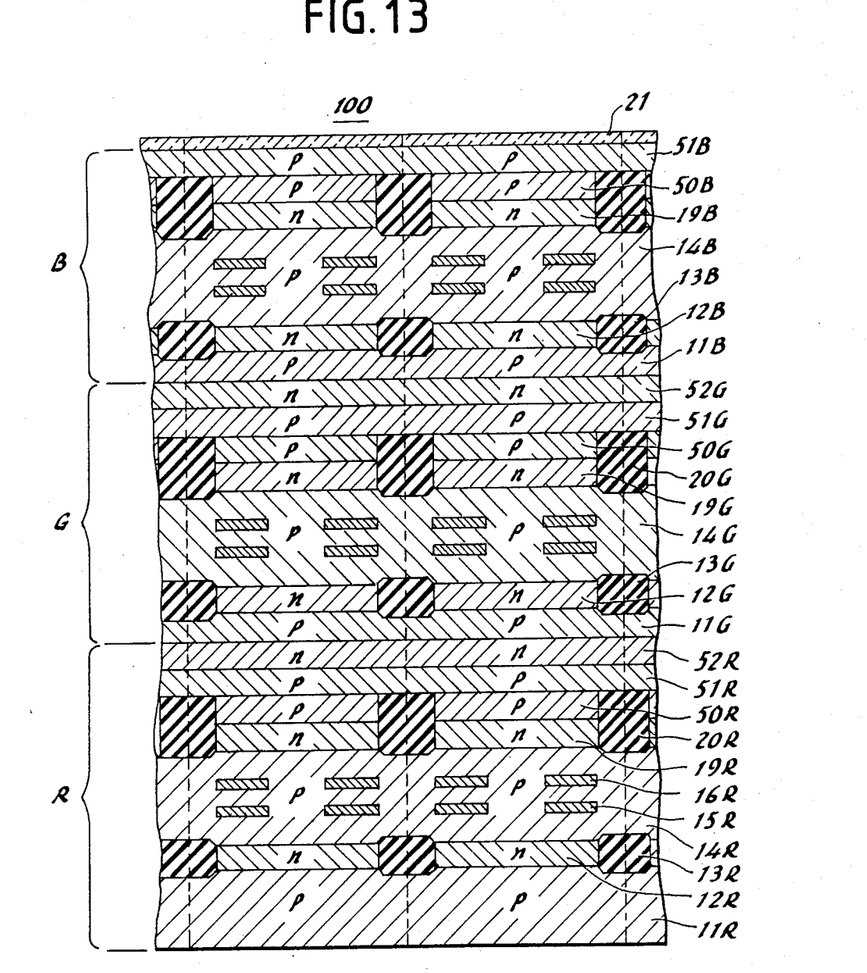
FIG. 13 is a cross-sectional view of an image display version of the transducer of FIG. 1 corresponding to FIG. 2.
Figure 14:
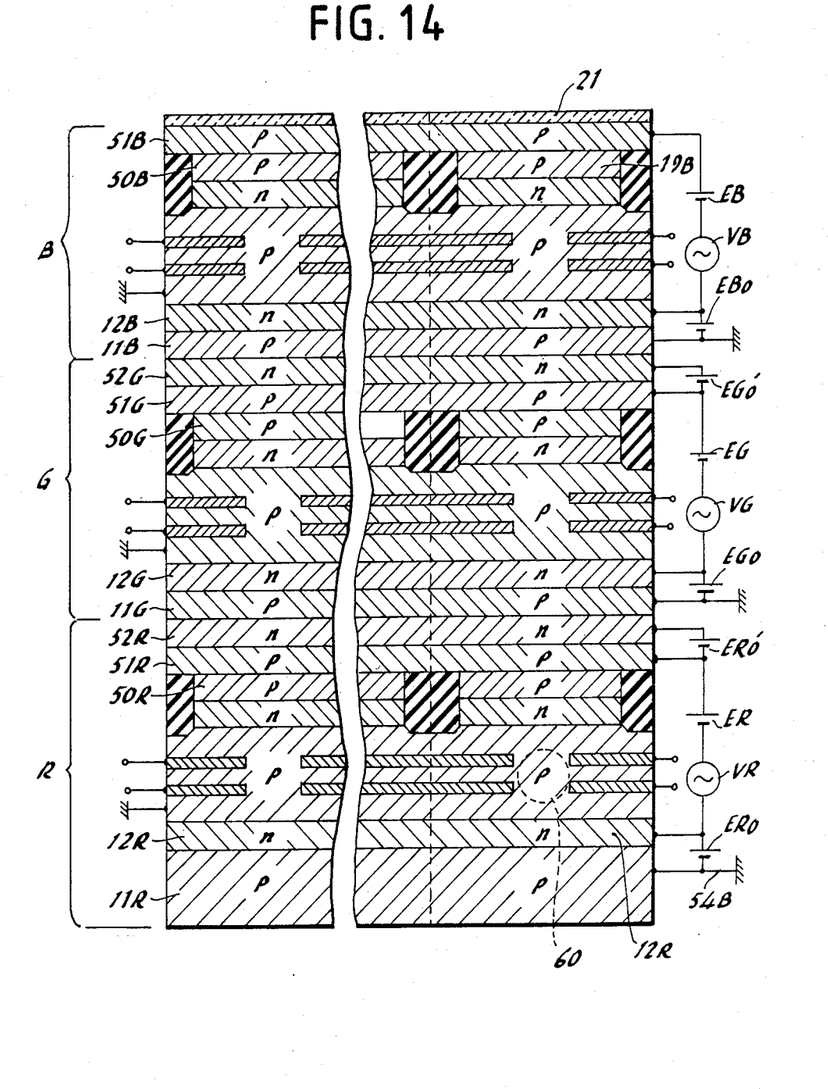
FIG. 14 is a cross-sectional view of the image display version corresponding to FIG. 6.

The photoelectrical conversion panel 10 may also be used as a television screen. However, it is preferable that for such image reconstruction purposes the panel 10 be constructed in a modified manner as shown at 100 in cross-section in FIGS. 13 and 14 which correspond to FIGS. 2 and 6 of the previous embodiment, respectively. In FIGS. 13 and 14, parts corresponding to those in FIGS. 2 and 6 are marked with the same numerals as used in FIGS. 2 and 6. The image display panel 100 differs from the light conversion panel 10 in that it additionally includes a p-type layer 50 on the n-type layer 19 and a separation region comprising p-type and n-type layers 51 and 52 disposed between the B and G regions and between the G and R regions. The B region is covered with a p-type layer 51B. As shown in FIG. 14, the p-type layer 11R and n-type layer 12R are reversely biased by a DC voltage source ERO and the p-type layer 51R and n-type layer 52R are likewise reversely biased by a voltage source ERO'. The p-type layer 51R and n-type bands 12R are biased by a DC source ER superimposed by a video signal supplied from a red signal source VR. These voltage sources are coupled in series to ground at 54B. Similarly, the corresponding layers of the G region are biased in the same manner as in the R region. The application of the bias voltage to the B region is similar to the other regions except that it includes no separation region on top of its layer 50B. The p-type layer 51 serves a common anode electrode for each of the light emitting regions B, G, R, while the n-type band 12 of each light emitting region serves as a common cathode for each columnwise pixel array.

Figure 15:
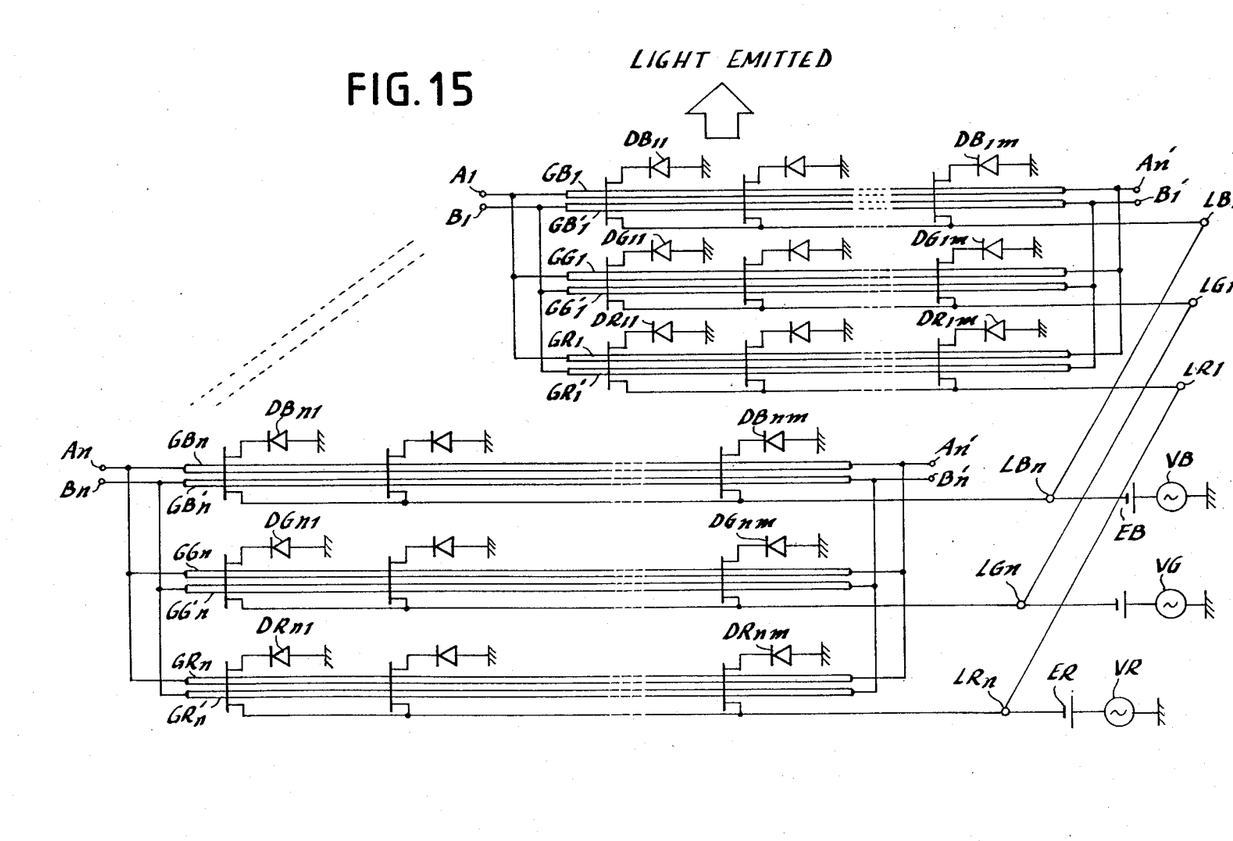
FIG. 15 is an equivalent circuit of the display panel.

The equivalent circuit of the light emitting panel 100 is similar to that shown in FIG. 11. Different color video signals may be applied individually to different columns simultaneously. For adaptation to the dot-sequential scanning methods employed in the current standard television systems, however, the terminals LB, LG and LR of each column are multipled to the corresponding terminals of the other columns as shown in FIG. 15. In this case the dot-sequential scanning circuit of FIG. 12 can also be employed in the reconstruction of light images.

The operation of columnwise scanning is exactly similar to that described above. When depletion occurs within a given pair of aligned windows as indicated by broken lines 60 in FIG. 14, a low impedance bridge is created between the charge transfer channel 12R and the n-type region 19R where electrons recombine with holes. As a result of the hole-electron recombination, red light is emitted at the pn junction 19R and transmitted upward to create a light spot of the intensity corresponding to the video signal VR. Likewise, green and blue light rays are emitted from the respective pn junctions and a single blend of these light spots is made to appear on the same pixel location, rather than as a triplet of spatially separated primary colors which is usually viewed on conventional television receivers.

In a modified form of the present invention, the multilayered structure may comprise a multitude of pn junctions of the same composition. Such multilayered structures can be used for detection and reconstruction of three-dimensional images, such as holographic images.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A photoelectrical transducer comprising:
a plurality of multilayered semiconductive structures, each of said structures comprising a charge transfer layer, a photoelectrical conversion layer having an array of photoelectrical conversion regions, and an intermediate layer sandwiched between said charge transfer layer and said photoelectrical conversion layer, said intermediate layer being of opposite conductivity type to the conductivity type of the other layers and including a pair of electrically resistive regions adapted for connection to a potential source for inducing in said intermediate layer a pair of field potential distributions having oppositely inclined gradients to cause depletion of charges to occur between said charge transfer layer and each one of said photoelectrical conversion regions.

2. A photoelectrical transducer as claimed in claim 1, wherein each of said resistive regions includes a series of windows corresponding to said photoelectrical conversion regions, said windows of each resistive region being aligned with the windows of the other resistive region to cause said depletion to occur in the aligned windows.

3. A photoelectrical transducer as claimed in claim 1, wherein said photoelectrical conversion layer of each of said multilayered structures is composed of a material having a different spectroscopic characteristic.

4. A photoelectrical transducer as claimed in claim 2, wherein said photoelectrical conversion layer of each of said multilayered structures is composed of multicomponent semiconductive compounds having a different bandgap energy.

5. A photoelectrical transducer, comprising:
a plurality of multilayered semiconductive structures, each of said structures comprising a first semiconductive layer of a first conductivity type, a second semiconductive layer of a second conductivity type on said first layer, a third semiconductive layer of the first conductivity type on said second layer and a fourth semiconductive layer of the second conductivity type on said third layer, said fourth layer having an array of photoelectrical conversion regions, said third layer including therein a pair of electrically resistive regions adapted for connection to a potential source for inducing in said third layer a pair of field potential distributions having oppositely inclined gradients to cause depletion of charges to occur between said second layer and each one of said photoelectrical conversion regions.

6. A photoelectrical transducer as claimed in claim 5, wherein each of said resistive regions includes a series of windows corresponding to said photoelectrical conversion regions, said windows of each resistive region being aligned with the windows of the other resistive region to cause said depletion to occur in the aligned windows.

7. A photoelectrical transducer as claimed in claim 5, wherein said photoelectrical conversion layer of each of said multilayered structures is composed of a material having a different spectroscopic characteristic.

8. A photoelectrical transducer as claimed in claim 7, wherein said photoelectrical conversion layer of each of said multilayered structures is composed of multicomponent semiconductive compounds having a different bandgap energy.

9. A photoelectrical conversion panel comprising:
a plurality of multilayered semiconductive structures, each of said structures comprising a charge transfer layer, a photoelectrical conversion layer having a two dimensional array of photoelectrical conversion regions, and an intermediate layer sandwiched between said charge transfer layer and said photoelectrical conversion layer, said intermediate layer being of opposite conductivity type to the conductivity type of the other layers and including a plurality of successively arranged electrically resistive elongated regions in pairs, each pair being adapted for connection to a potential source for inducing in said intermediate layer a pair of field potential distributions having oppositely inclined gradients to cause depletion of charges to occur between said charge transfer layer and each one of said photoelectrical conversion regions.

10. A photoelectrical conversion panel as claimed in claim 9, wherein each of said resistive regions includes a series of windows corresponding to said photoelectrical conversion regions, said windows of each resistive region being aligned with the windows of the other resistive region to cause said depletion to occur in the aligned windows.

11. A photoelectrical conversion panel as claimed in claim 9, further comprising a plurality of p and n conductivity type layers in pairs respectively disposed between said multilayered structures.

12. A photoelectrical conversion panel as claimed in claim 9, wherein said photoelectrical conversion layer of each of said multilayered structures is composed of a material having a different spectroscopic characteristic.

13. A photoelectrical conversion panel as claimed in claim 12, wherein said photoelectrical conversion layer of each of said multilayered structures is composed of multicomponent semiconductive compounds having a different bandgap energy.

14. A photoelectrical conversion panel, comprising:
a plurality of multilayered semiconductive structures, each of said structures comprising a first semiconductive layer of a first conductivity type, a second semiconductive layer of a second conductivity type on said first layer, a third semiconductive layer of the first conductivity type on said second layer and a fourth semiconductive layer of the second conductivity type on said third layer, said fourth layer having a two dimensional array of photoelectrical conversion regions, said third layer including therein a plurality of successively arranged electrically resistive elongated regions in pairs, each pair being adapted for connection to a potential source for inducing in said third layer a pair of field potential distributions having oppositely inclined gradients to cause depletion of charges to occur between said second layer and each one of said photoelectrical conversion regions.

15. A photoelectrical conversion panel as claimed in claim 14, wherein each of said resistive regions includes a series of windows corresponding to said photoelectrical conversion regions, said windows of each resistive region being aligned with the windows of the other resistive region to cause said depletion to occur in the aligned windows.

16. A photoelectrical conversion panel as claimed in claim 14, further comprising a plurality of p and n conductivity type layers in pairs respectively disposed between said multilayered structures.

17. A photoelectrical conversion panel as claimed in claim 14, wherein said photoelectrical conversion layer of each of said multilayered structures is composed of a material having a different spectroscopic characteristic.

18. A photoelectrical conversion panel as claimed in claim 17, wherein said photoelectrical conversion layer of each of said multilayered structures is composed of multicomponent semiconductive compounds having a different bandgap energy.

* * * * *